(12) United States Patent
Hwang

(10) Patent No.: US 6,573,768 B2
(45) Date of Patent: Jun. 3, 2003

(54) POWER-ON CIRCUIT OF A PERIPHERAL COMPONENT

(75) Inventor: Bar-Chung Hwang, Taoyuan (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/125,139

(22) Filed: Apr. 18, 2002

(65) Prior Publication Data

US 2003/0076138 A1 Apr. 24, 2003

(30) Foreign Application Priority Data

Oct. 22, 2001 (TW) ........................................ 90126038 A

(51) Int. Cl.[7] ................................................ H03L 7/00
(52) U.S. Cl. ........................................................ 327/143
(58) Field of Search ................................ 327/142, 143, 327/198

(56) References Cited

U.S. PATENT DOCUMENTS 5,442,312 A * 8/1995 Walter ........................ 327/198
6,084,446 A * 7/2000 Chen et al. .................. 327/143
6,085,342 A * 7/2000 Marholev et al. ........... 714/724
6,407,598 B1 * 6/2002 Ogane ........................ 327/143

* cited by examiner

Primary Examiner—Jeffrey Zweizig
(74) Attorney, Agent, or Firm—Ladas & Parry

(57) ABSTRACT

The present invention discloses a power-on circuit of a peripheral component, which comprises a switch control circuit for controlling the enabling time of a P-type or N-type transistor. For a P-type transistor, the switch control circuit includes a pull-high element, a current source and a current switch. For a N-type transistor, the switch control circuit includes a pull-down element, a current source and a current switch. The enabling time of the P-type or N-type transistors are controlled by the switch control circuit and the capacitor shunt with the switch control circuit so as to slowly enable the transistor switch. In other words, the present invention uses the slowly increasing or decreasing characteristic caused by charging the capacitor with the current source to control the P-type or N-type transistor switch so as to obtain the purpose of slowly enabling the power supply. For designing an IC, it is easy to design a constant current source, which occupies only little area, and the disadvantage of the prior art is thereby resolved.

8 Claims, 3 Drawing Sheets

US 6,573,768 B2

POWER-ON CIRCUIT OF A PERIPHERAL COMPONENT

BACKGROUND OF THE INVENTION

1. Field of the Invention

The present invention relates to a power-on circuit of a peripheral component, particularly to a circuit for reducing instant impulses when the power supply of a peripheral component is turned on.

2. Description of Related Art

Peripheral components in the modern industries, such as USB (Universal Serial Bus) devices, capture power supply from a USB host. When a USB host is connecting to a USB device, the USB host will provide 100 mA power supply current to the USB device. After the connection is established, the USB device demands the USB host to supply more current. But before the connection is established, due to the existence of filtering and stray capacitors, impulses caused by a power-on current always happen so that a Hub responsible for monitoring the power supply and building a connection protocol will mistake an overloading occurrence of the power supply and disconnect the USB device.

To resolve the above problem, a prior USB system joins a power-on apparatus between the power supply end and the USB device, shown as FIG. 1. The prior power-on apparatus mainly uses a resistor 16 and loading capacitor 15 to form a RC charging/discharging circuit for preventing current impulses, and uses a switch 14 to bypass the resistor 16 after a period of time to avoid a voltage drop caused by the resistor 16 in a normal connection. Besides, the prior power-on apparatus further comprises a switch 13 for conducting the USB power supply when the power-on signal turns on, and a delay circuit 11 turns on the switch 14 after a period of time.

FIG. 2 shows a circuit diagram of another prior power-on apparatus. Similar to the theorem with the prior circuit shown in FIG. 1, the prior power-on apparatus only uses a diode 21, a second capacitor 23 and a PNP transistor 22 to replace the switches 13 and 14 and a delay circuit 11 in FIG. 1. In FIG. 2, when the power-on signal turns on and output from a diode 21, a RC channel formed by the second capacitor 23 and resistor 16 will slowly enable the PNP transistor 22.

From the viewpoint of designing an IC, the area of a resistor is so large and wastes a chip area. Therefore, how to efficiently design a circuit that properly builds a connection protocol of the peripheral component and saves a chip area is an important issue.

SUMMARY OF THE INVENTION

The main object of the present invention is to provide a power-on circuit, which can avoid improperly shutting down a connection due to an impulse phenomenon when the power supply is being turned on.

The second object of the present invention is to provide a power-on circuit, which occupies little chip area.

The third object of the present invention is to provide a power-on circuit, which is easy to control the enabling time of the power supply.

To obtain the above purpose, the power-on circuit of the present invention comprises a switch control circuit for controlling the switching of a P-type or N-type transistor. For the P-type transistor, the switch control circuit includes a pull-high element, a current source and a current switch. For the N-type transistor, the switch control circuit includes a pull-down element, a current source and a current switch. The enabling time of the P-type or N-type transistors is controlled by the switch control circuit and the capacitor shunt with the switch control circuit so as to slowly enable the transistor switch. In other words, the present invention utilizes the slowly increasing or decreasing characteristic caused by charging the capacitor with the current source to control the enabling time of the P-type or N-type transistor switch so as to obtain the purpose of slowly enabling the power supply of the peripheral component. For designing an IC, it is easy to design a constant current source that occupies only little chip area, and the disadvantage of the prior art is thereby resolved.

BRIEF DESCRIPTION OF THE DRAWINGS

The present invention will be described according to the appended drawings in which.

PREFERRED EMBODIMENT OF THE PRESENT INVENTION

Figure 1:
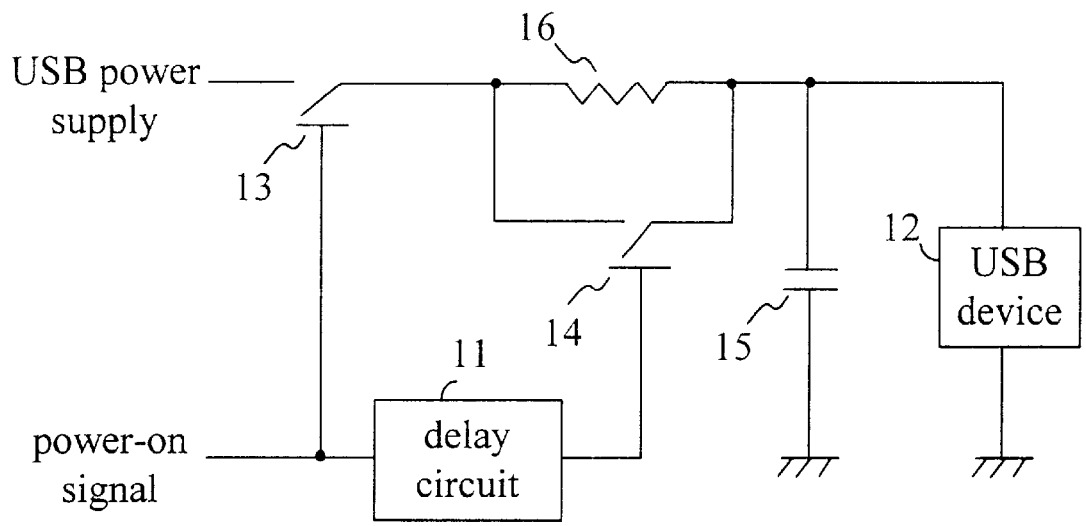
FIG. 1 shows a prior art power-on circuit.
Figure 2:
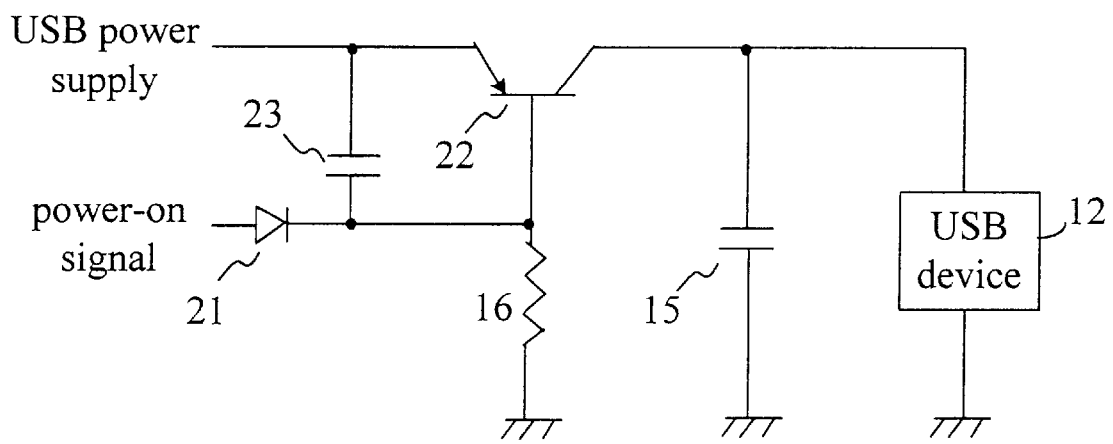
FIG. 2 shows another prior art power-on circuit.
Figure 3A:
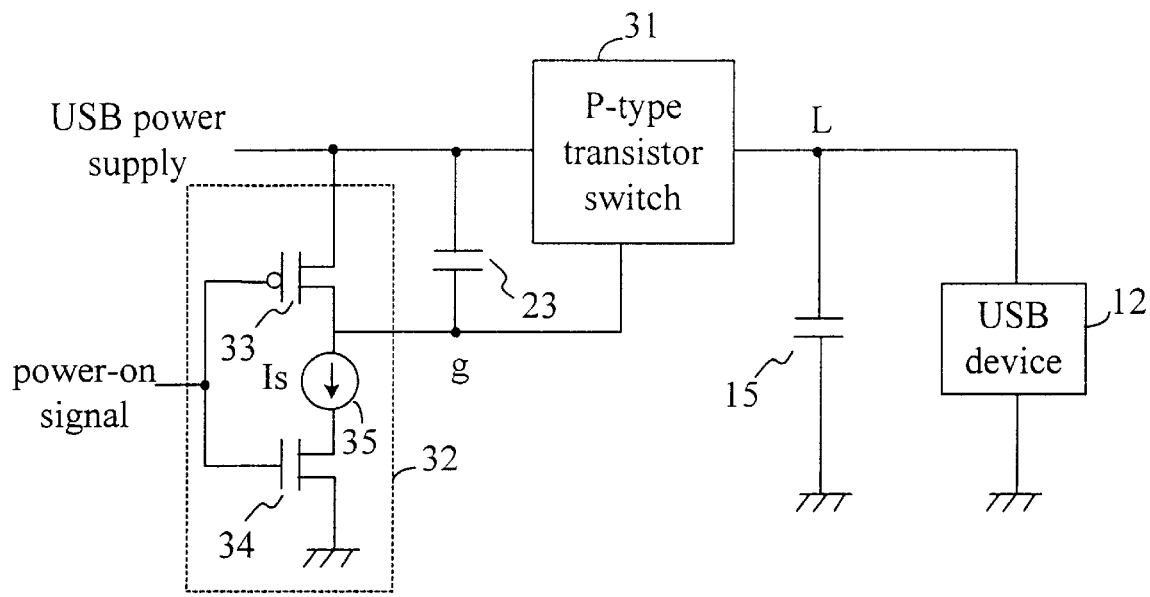
FIGS. 3(a) and 3(b) shows a power-on circuit of the present invention.
Figure 3B:
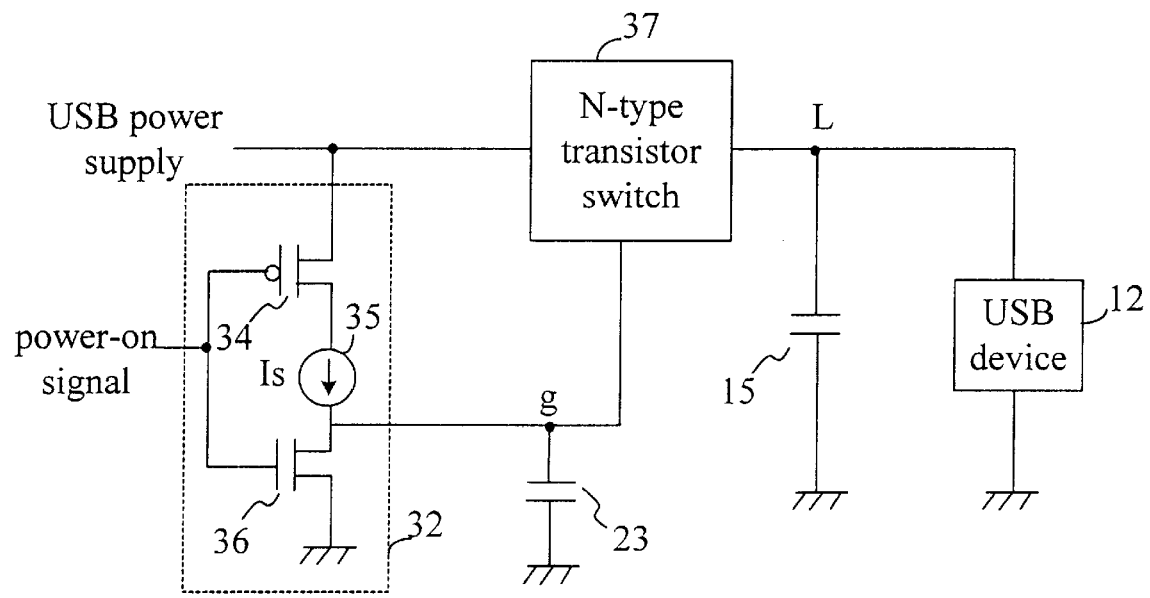

FIGS. 3(a) and 3(b) shows a power-on circuit of the present invention. In FIG. 3(a), a switch control circuit 32 is used to control the enabling time of a P-type transistor switch 31, and using a current source 35 of the switch control circuit 32 to charge a capacitor 23 so as to raise a g-point voltage and obtain the purpose of slowly raising an L-point voltage. The power-on circuit of the present invention comprises a pull-high element (such as a weak P-type transistor) 33, a current source 35 and a current switch (such as a N-type transistor) 34. When the power-on signal has not been turned on, the pull-high element 33 raises the g-point (the gate of the P-type transistor switch 31) voltage $V_g$ into the voltage level of the power supply to avoid erroneously enabling the P-type transistor 31 due to a voltage drop of $V_g$ caused by a leakage current. A current mirror can build the current source 35, and the current from the current source 35 directs to the ground terminal. The current switch 34 provides a path, which is electrically connected to current source and the ground terminal. To design an IC, the area occupied by the current source is far less than that of the resistor, and the effect of a process and temperature variation to current source is less than that to a resistor. Therefore, it is an important issue for the present invention to replace a resistor by a current source. In FIG. 3(b), a switch control circuit 32 is used to control the enabling time of the N-type transistor switch 37, and the current source 35 of the switch control circuit 32 is used to charge the capacitor 23 so as to slowly raise the g-point voltage and obtain the purpose of slowly raising the L-point voltage. The power-on circuit of the present invention includes a pull-down element (such as a weak N-type transistor) 36, a current source 35 and a current switch (such as a P-type transistor) 34. When the power-on signal has not turned on, the pull-down element 36 will pull down the g-point voltage $V_g$ into the voltage level of the ground terminal to avoid erroneously enabling the N-type transistor 37 due to a voltage raise of $V_g$ caused by a leakage current. A current mirror can build the current source 35, and the current from the current source flows into the ground terminal. When the power-on signal turns on, the current switch 34 provides a path, which is electrically connected the current source to the USB power supply. Besides, the P-type transistor switch 31 or N-type transistor switch 37 can be formed by a bipolar, MOS transistors or other forms, the present invention does not limit in this way.

Figure 4A:
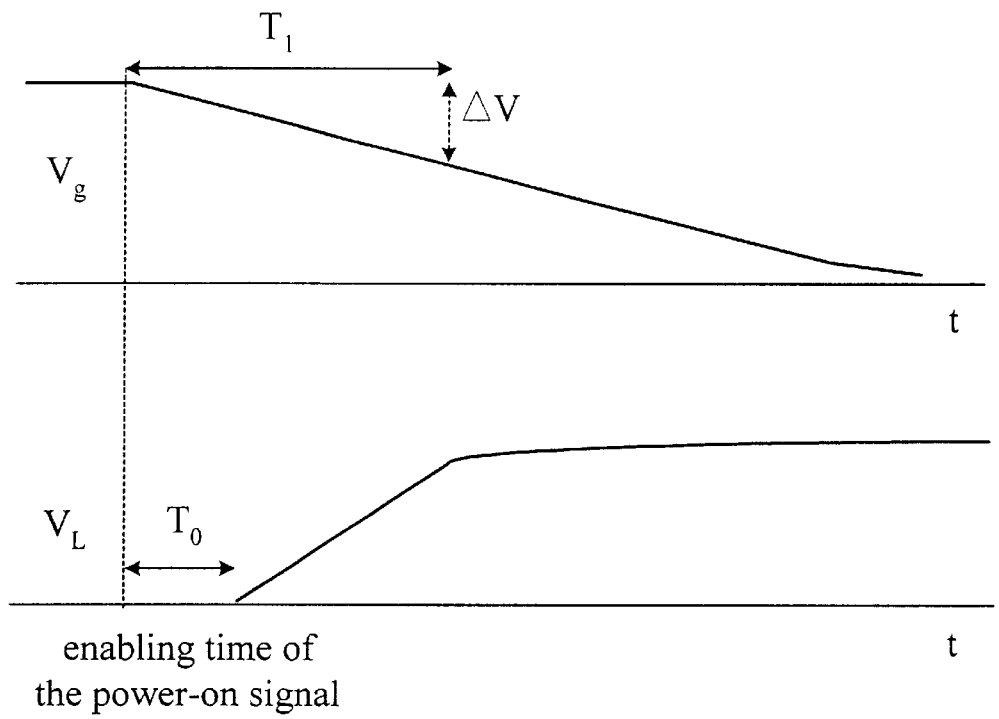
FIGS. 4(a) and 4(b) shows a timing diagram of the power-on circuit of the present invention.
Figure 4B:
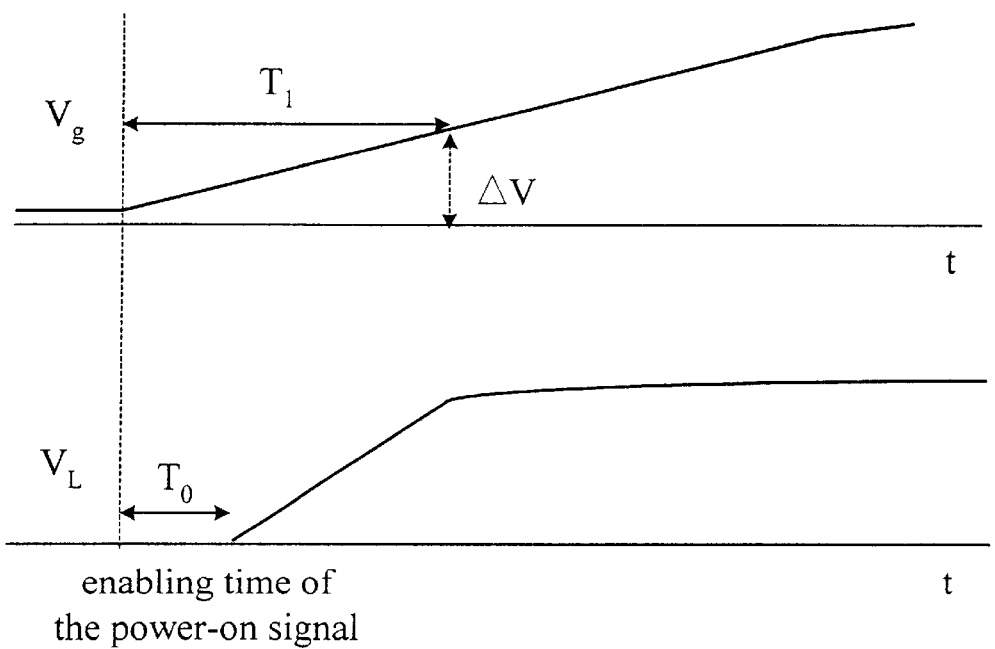

FIG. 4(a) shows a timing diagram of the structure in FIG. 3(a), and FIG. 4(b) shows a timing diagram of the structure in FIG. 3(b). In FIG. 4(a), when the power-on signal has turned on, signal $V_g$ will decrease from the voltage level of the power supply. In other words, the L-point voltage $V_L$ will gradually increase after a cut-in period $T_0$, and reach a stable output voltage after a period $T_1$. The period $T_1$ can be calculated by the following equation:

$$T_1 = \frac{C \times \Delta V}{I_s} \quad (1)$$

In equation (1), C represents the capacitance of the second capacitor 23, $\Delta V$ represents a voltage drop of $V_g$. In FIG. 4(b), when the power-on signal turns on, the signal $V_g$ will gradually raise. Relatively, the L-point voltage $V_L$ will gradually raise after a cut-in period $T_0$, and reach a stable output voltage after a period $T_1$.

The above-described embodiments of the present invention are intended to be illustrative only. Numerous alternative embodiments may be devised by those skilled in the art without departing from the scope of the to following claims.

What is claimed is:

1. A power-on circuit of a peripheral component, comprising a capacitor, a P-type transistor switch and a switch control circuit, characterized in that said switch control circuit comprises:

a current source connected to a power supply of said peripheral component; and a current switch for providing a path connecting said current source and a ground terminal when said power supply is enabled;

whereby said current source charges said capacitor so as to slowly enable said P-type transistor switch.

2. The power-on circuit of claim 1, wherein said P-type transistor switch is a bipolar transistor or a MOS transistor.

3. The power-on circuit of claim 1, further comprising a pull-high element situated between said current source and said power supply of said peripheral component, said pull-high element electrically connected said P-type transistor switch to said power supply of said peripheral component when said power supply is not enabled.

4. The power-on circuit of claim 1, wherein said current switch is an N-type transistor.

5. A power-on circuit of a peripheral component, comprising a capacitor, a N-type transistor switch and a switch control circuit, characterized in that said switch control circuit comprises:

a current source connected to a power supply of said peripheral component; and a current switch for providing a path connecting said current source and a ground terminal when said power supply is enabled;

whereby said current source charges said capacitor so as to slowly enable said N-type transistor switch.

6. The power-on circuit of claim 5, wherein said N-type transistor switch is a bipolar transistor or a MOS transistor.

7. The power-on circuit of claim 5, further comprising a pull-low element situated between said current source and said power supply of said peripheral component, said pull-low element electrically connected said N-type transistor switch to said ground terminal when said power supply is not enabled.

8. The power-on circuit of claim 5, wherein said current switch is a P-type transistor.

* * * * *